(12) United States Patent
Chen et al.

(10) Patent No.: US 9,165,959 B2
(45) Date of Patent: Oct. 20, 2015

(54) IMAGE SENSOR WITH PIXEL UNITS HAVING MIRRORED TRANSISTOR LAYOUT

(71) Applicant: OMNIVISION TECHNOLOGIES, INC., Santa Clara, CA (US)

(72) Inventors: Gang Chen, San Jose, CA (US); Duli Mao, Sunnyvale, CA (US); Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 327 days.

(21) Appl. No.: 13/775,747

(22) Filed: Feb. 25, 2013

(65) Prior Publication Data

US 2014/0239152 A1 Aug. 28, 2014

(51) Int. Cl.
*H01L 27/146* (2006.01)
(52) U.S. Cl.
CPC .... *H01L 27/14605* (2013.01); *H01L 27/14612* (2013.01); *H01L 27/14641* (2013.01); *H01L 27/14603* (2013.01); *H01L 27/14607* (2013.01)
(58) Field of Classification Search
CPC ............... H04N 5/045; H04N 5/37457; H01L 27/14605; H01L 27/14641; H01L 27/14612; H01L 27/14603; H01L 27/14607
See application file for complete search history.

(56) References Cited

U.S. PATENT DOCUMENTS

| | | | |
|---|---|---|---|
| 6,657,665 B1 | 12/2003 | Guidash | |
| 8,314,870 B2 | 11/2012 | Itonaga et al. | |
| 8,922,685 B2 * | 12/2014 | Nakata et al. | 348/294 |
| 8,946,611 B2 * | 2/2015 | Iwata | 250/208.1 |
| 2010/0177226 A1 | 7/2010 | Itonaga et al. | |
| 2012/0224089 A1 * | 9/2012 | Sato | 348/308 |

OTHER PUBLICATIONS

Itonaga, K., et al., "Extremely-Low Noise CMOS Image Sensor with High Saturation Capacity," Semiconductor Technology Development Division, Sony Corporation, Kanagawa, Japan, Electron Devices Meeting (IEDM), 2011 IEEE International, vol., No., pp. 8.1.1-8.1.4, Dec. 5-7, 2011.

* cited by examiner

*Primary Examiner* — Tony Ko
(74) *Attorney, Agent, or Firm* — Blakely Sokoloff Taylor & Zafman LLP

(57) ABSTRACT

An image sensor includes a first pixel unit horizontally adjacent to a second pixel unit. Each pixel unit includes plurality of photodiodes and a shared floating diffusion region. A first pixel transistor region of the first pixel unit has a plurality of pixel transistors. A second pixel transistor region of the second pixel unit is horizontally adjacent to the first pixel transistor region and also has a plurality of pixel transistors. A transistor layout of the second pixel transistor region is a minor image of a transistor layout of the first pixel transistor region.

19 Claims, 8 Drawing Sheets

IMAGE SENSOR WITH PIXEL UNITS HAVING MIRRORED TRANSISTOR LAYOUT

TECHNICAL FIELD

This disclosure relates generally to image sensors, and in particular but not exclusively, relates to the layout of complementary metal oxide semiconductor (CMOS) image sensors.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors.

Conventional CMOS image sensors typically have a configuration in which a plurality of pixels are arranged into a two-dimensional array, where each pixel includes a photodiode and associated pixel transistors. Recently, with the continued miniaturization of image sensors, in order to reduce the area occupied by each pixel, a pixel sharing structure has been implemented where pixel transistors are shared among several photodiodes. However, typical layouts of a pixel sharing structure often suffer from leakage problems between various portions of the pixel transistors due to their close proximity to one another.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an Image Sensor with Pixel Units having a Mirrored Transistor Layout are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
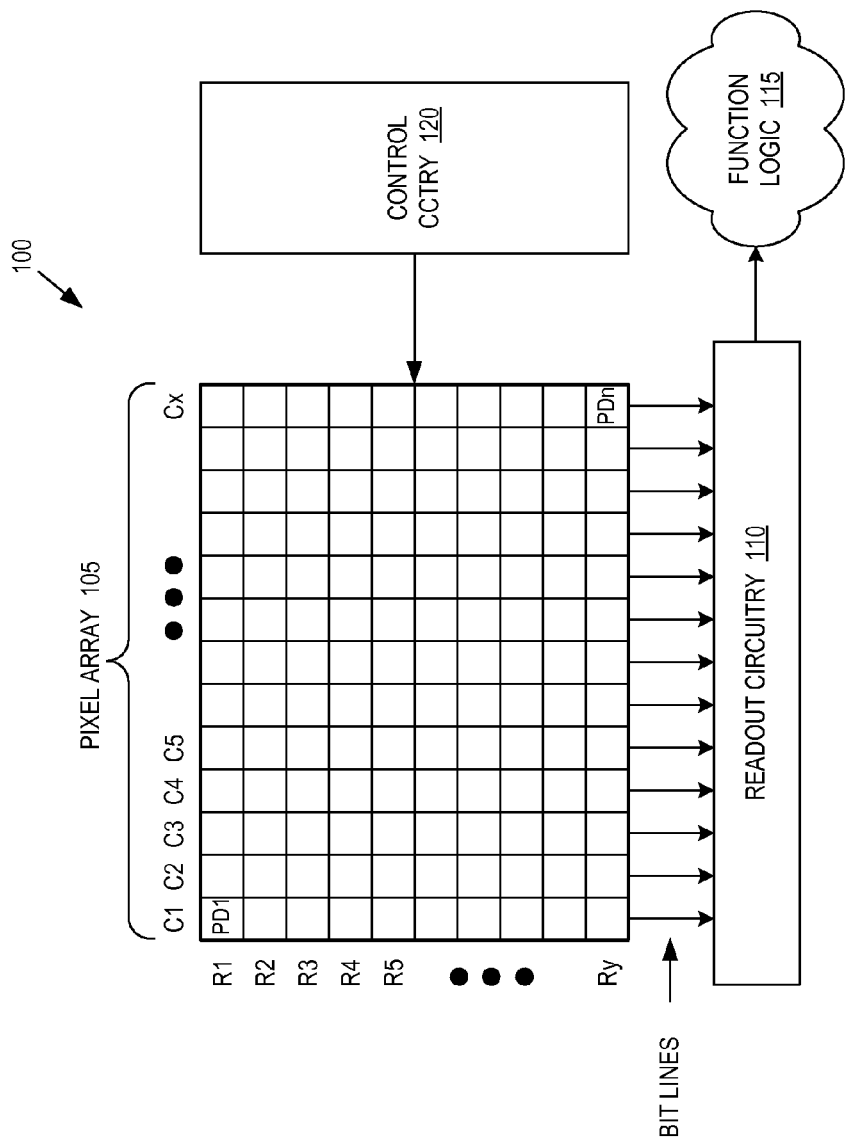
FIG. 1 is a block diagram illustrating an image sensor, in accordance with an embodiment of the present disclosure.

FIG. 1 is an block diagram illustrating an image sensor 100, in accordance with an embodiment of the present disclosure. The illustrated embodiment of image sensor 100 includes an active area (i.e., pixel array 105), readout circuitry 110, function logic 115, and control circuitry 120.

For example, pixel array 105 may be a two-dimensional array of backside or frontside illuminated imaging pixels (e.g., pixels PD1, ..., Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render an image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate the image data by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristics of pixel array 105. For example, control circuitry 120 may generate a shutter signal for controlling image acquisition.

Figure 2:
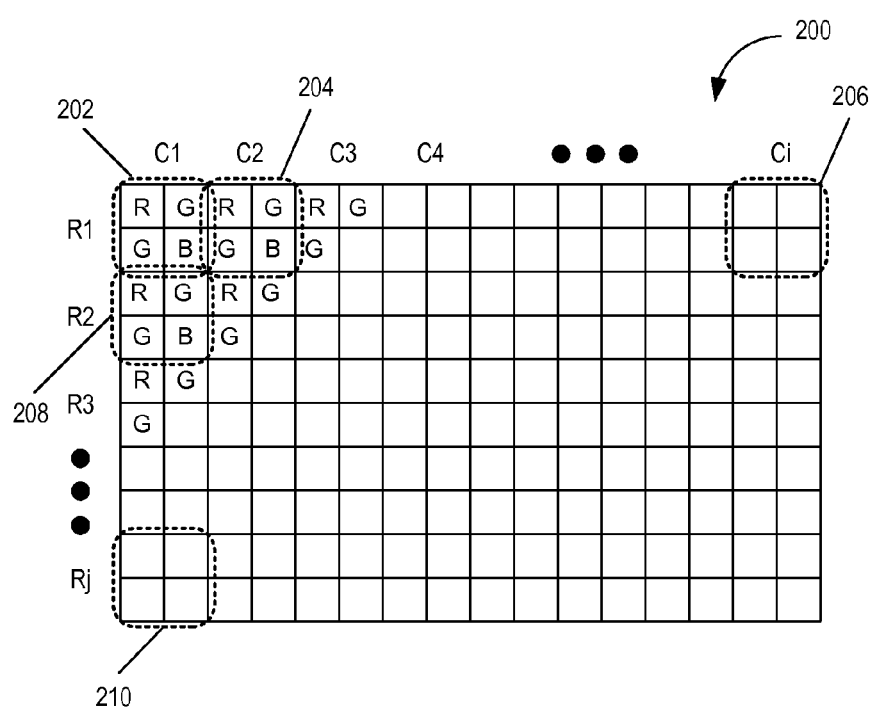
FIG. 2 is a diagram of an array of pixel units of an image sensor, in accordance with an embodiment of the present disclosure.

FIG. 2 is a diagram of an array 200 of pixel units (e.g., pixel units 202, 204, 206, 208, and 210) of an image sensor, in accordance with an embodiment of the present disclosure. In one aspect, a "pixel unit" is a grouping of one or more imaging pixels, such as the imaging pixels of pixel array 105 in image sensor 100 in FIG. 1. A pixel unit may include several photodiodes each corresponding with a separate pixel of the pixel unit, and may also include at least one pixel transistor that is shared among the photodiodes of the pixel unit.

Several color imaging pixels may be included in the active area of an image sensor, such as red (R), green (G), and blue (B) imaging pixels. For example, pixel unit 202 is illustrated as including four color imaging pixels (e.g., one R pixel, one B pixel, and two G pixels) arranged into a Bayer pattern. Other color imaging pixels and other color patterns, not shown, may be implemented into the pixel unit in accordance with the teachings of the present disclosure.

As illustrated, each pixel unit of array 200 is arranged into a row (e.g., rows R1 to Rj) and a column (e.g., column C1 to Ci). Thus, an image sensor in accordance with the teachings herein may include both an array of imaging pixels and an array of pixel units, where the array of pixel units is an organized grouping of the imaging pixels in the pixel array. Also, as will be discussed in further detail below, each pixel unit may have a pixel transistor layout that is a mirror image of the pixel unit adjacent in the next column. For example, the pixel transistor layout of pixel unit 204 may be a mirror image of the pixel transistor layout of pixel unit 202.

Figure 3:
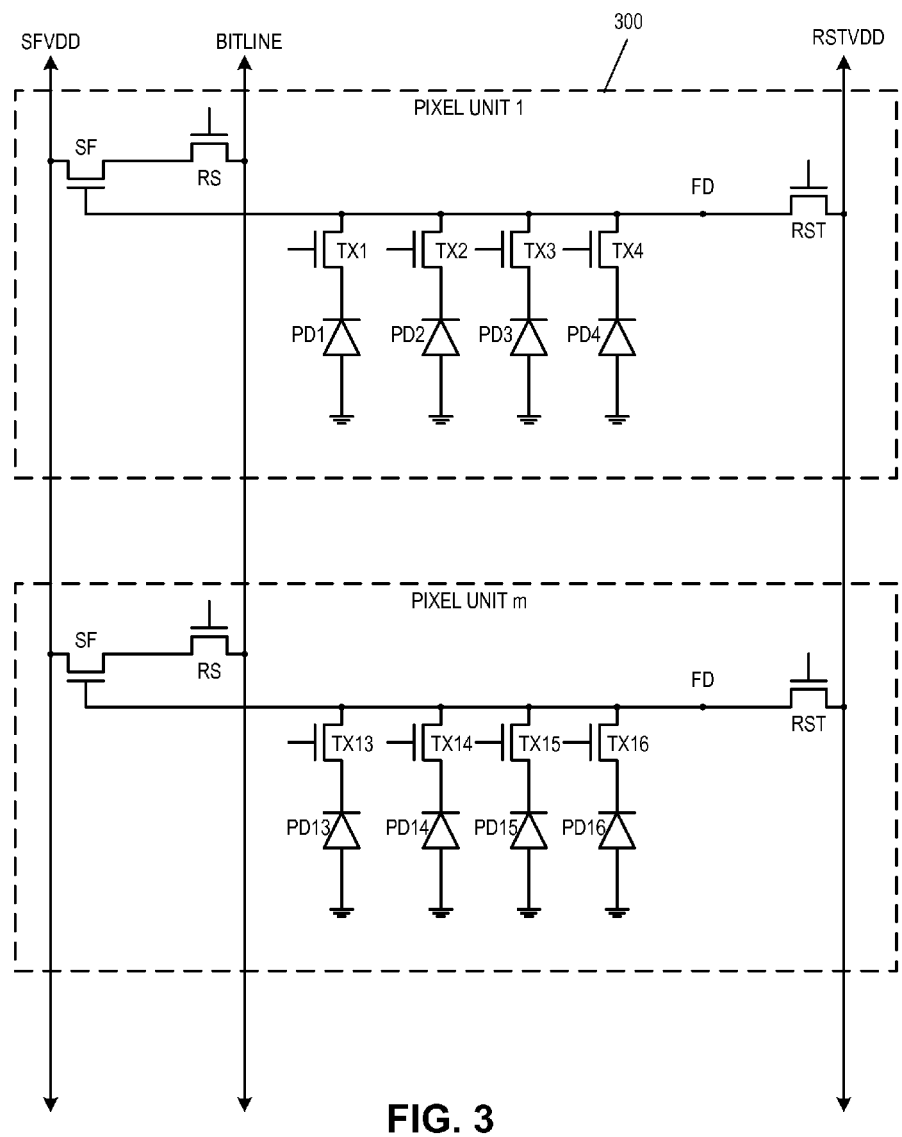
FIG. 3 is a circuit diagram illustrating pixel circuitry of two pixel units within an image sensor, in accordance with an embodiment of the present disclosure.

FIG. 3 is a circuit diagram illustrating pixel circuitry of two pixel units within an image sensor, in accordance with an embodiment of the present disclosure. Pixel circuitry 300 is one possible pixel circuitry architecture for implementing each pixel unit within array 200 of FIG. 2. However, it should be appreciated that embodiments of the present invention are not limited to the illustrated pixel architectures; rather, one of ordinary skill in the art having the benefit of the instant disclosure will understand that the present teachings are also applicable to various other pixel architectures.

In FIG. 3, pixel unit 1 and pixel unit m are arranged in two rows and one column. The illustrated embodiment of each pixel circuitry includes four photodiodes (PD1-PD4), four transfer transistors (TX1-TX4), a reset transistor RST, a source-follower transistor SF, and a row select transistor RS. During a readout operation of the first photodiode PD1, transfer transistor TX1 receives a transfer signal, which causes transfer transistor TX1 to transfer the charge accumulated in photodiode PD1 to a shared floating diffusion region FD.

Reset transistor RST is coupled between a reset voltage supply RSTVDD and the floating diffusion region FD to reset (e.g., discharge or charge the FD to a preset voltage) under control of a reset signal. The floating diffusion region FD is coupled to the gate of the source-follower transistor SF. The source-follower transistor SF is coupled between a source-follower voltage supply SFVDD and row select transistor RS. The source-follower transistor SF operates as a source-follower providing a high impedance output from floating diffusion region FD. Finally, row select transistor RS selectively couples the output of the pixel circuitry to the column bitline under control of a row select signal. In one embodiment, the transfer signals, the reset signal, and the row select signal are generated by control circuitry 120. The transfer signals, the reset signal, the row select signal, the source-follower voltage supply SFVDD, the reset voltage supply RSTVDD, and ground may be routed in the pixel circuitry by way of metal interconnect layers (i.e., routings) included in the image sensor.

Figure 4:
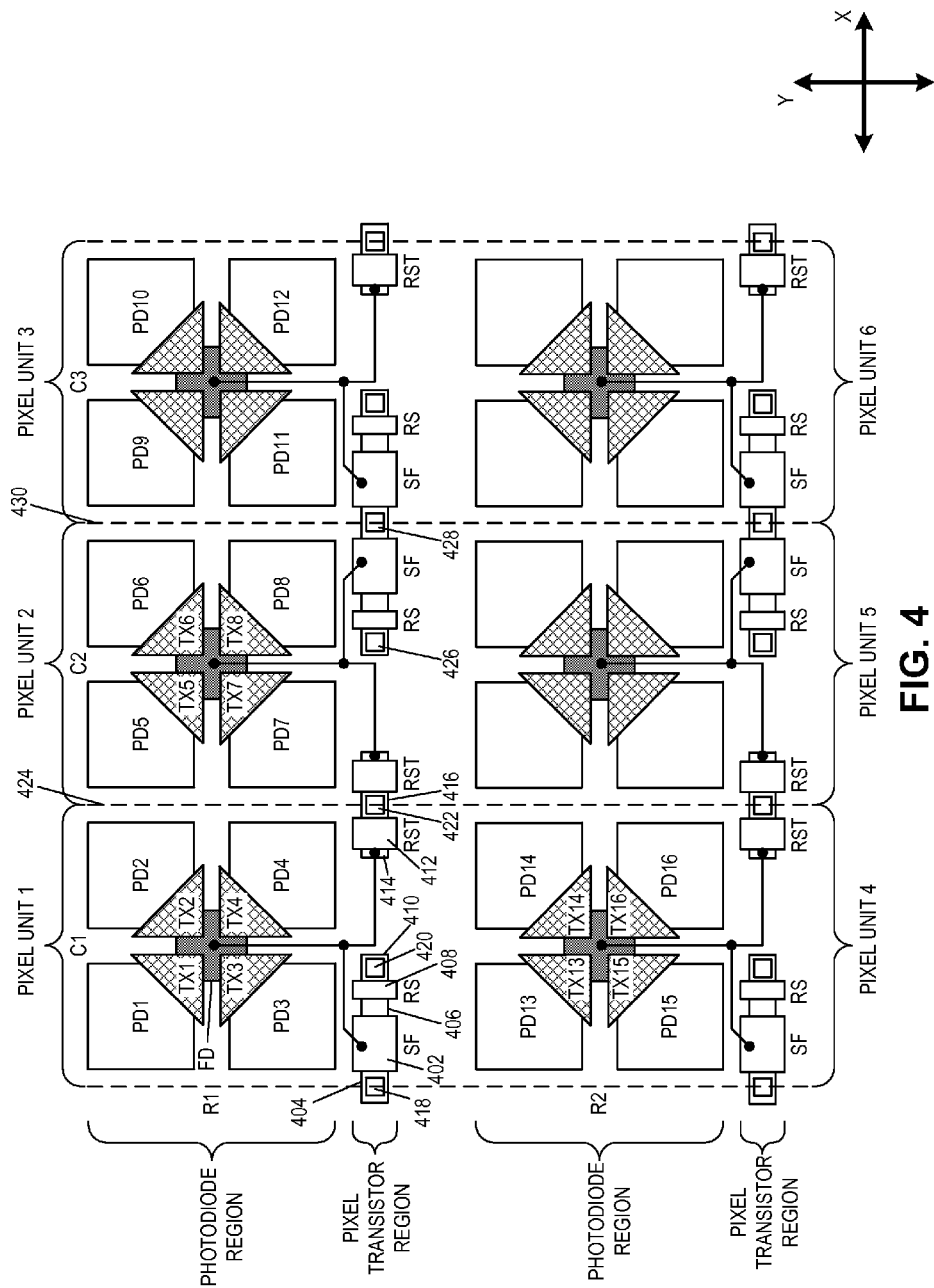
FIG. 4 is a diagram of six pixel units of an image sensor having mirrored transistor layouts, in accordance with an embodiment of the present disclosure.

FIG. 4 is a diagram of six pixel units (e.g., pixel unit 1-6) of an image sensor having mirrored pixel transistor layouts, in accordance with an embodiment of the present disclosure. The six pixel units of FIG. 4 are arranged into two rows (R1 and R2) and three columns (C1 to C3) of pixel units, which includes a total of 4 rows and 6 columns of pixels. Pixel units 1-6 may represent, at least, some of the pixel units included in array 200 of FIG. 2. For example, pixel unit 1 may correspond to pixel unit 202 of FIG. 2, pixel unit 2 may correspond to pixel unit 204, and pixel unit 4 may correspond to pixel unit 208.

As shown in FIG. 4, each pixel unit includes a photodiode region and a pixel transistor region. Within the photodiode region, each illustrated pixel unit includes four photodiodes (PDn), four transfer gates (TXn), and a shared floating diffusion region FD. In the illustrated example of FIG. 4, each pixel unit includes no more and no less than four photodiodes and no more than one shared floating diffusion region FD. Also, the coupling of floating diffusion regions together will increase a floating diffusion capacitance which may lead to a decrease in conversion gain/sensitivity. Thus, in one embodiment, the floating diffusion region FD of each pixel unit is not coupled to any other floating diffusion region of any other pixel unit.

Within the pixel transistor region, each illustrated pixel unit includes a source-follower transistor SF, a row select transistor RS, and a reset transistor RST. The source follower transistor SF includes a gate 402 and doped regions 404 and 406 (i.e., drain and source). The row select transistor RS includes a gate 408 and doped regions 406 and 410. The reset transistor RST is shown as including a gate 412 and doped regions 414 and 416. The pixel circuitry of each pixel unit couple and function as was described above with reference to the circuit diagram of FIG. 3 for reading out image data from a respective floating diffusion region. For example, during a readout operation of the first photodiode PD1, transfer gate TX1 receives a transfer signal, which causes the transfer of charge accumulated in photodiode PD1 to the shared floating diffusion region FD of pixel unit 1.

The reset transistor RST of pixel unit 1 is coupled to reset (e.g., discharge or charge the FD to a preset voltage) under control of a reset signal received at gate 412. The floating diffusion region FD of pixel unit 1 is coupled to gate 402 of the source-follower transistor SF. The source-follower transistor SF of pixel unit 1 operates as a source-follower providing a high impedance output from the associated floating diffusion region FD. Finally, the row select transistor RS of pixel unit 1 selectively couples the output of pixel unit 1's pixel circuitry to the column bitline connection 420 under control of a row select signal received at gate 408.

Also included in the pixel transistor region is a shared source follower voltage supply connection 418, a column bitline connection 420, and a shared reset voltage supply connection 422. In one embodiment, connections 418, 420 and 422 are metal pads for connecting with metal routings (discussed below with reference to FIG. 5) that carry their respective signals among several pixel units.

The pixel transistor regions of FIG. 4 are shown as being vertically displaced (along the y-axis) outside of their respective photodiode regions. For example, the pixel transistor region of pixel unit 1 is vertically displaced below and outside of the photodiode region of pixel unit 1 such that the pixel transistor region of pixel unit 1 is disposed between the photodiode region of pixel unit 1 and the photodiode region of the pixel unit in the row below (i.e., pixel unit 4). Also, the photodiode and pixel transistor regions are horizontally adjacent to the photodiode and pixel transistor regions of pixel units in the same row. For example, pixel unit 2 is horizontally adjacent (along the x-axis) to pixel unit 1 which means that the photodiode region of pixel unit 2 is horizontally adjacent to the photodiode region of pixel unit 1 and that the pixel transistor region of pixel unit 2 is horizontally adjacent to the pixel transistor region of pixel unit 1.

Further shown in FIG. 4 is that the pixel transistor layout of each pixel transistor region is a minor image of the pixel transistor layout of a horizontally adjacent pixel transistor region. That is, in one embodiment, the pixel transistor layout of one pixel transistor region is identical, but reversed from that of a horizontally adjacent pixel transistor region. By way of example, the pixel transistor layout of the pixel transistor region of pixel unit 2 is a minor image of the pixel transistor layout of the pixel transistor region of pixel unit 1. Reading from left to right along the x-axis, the transistor layout of pixel unit 1 includes the source follower voltage supply connection 408, the source-follower transistor SF, the row select transistor RS, the column bitline connection 420, the reset transistor RST, and finally the reset voltage supply connection 422, while, still reading from left to right, the transistor layout of pixel unit 2 includes the reset voltage supply connection 422, the reset transistor RST, the column bitline connection 426, the row select transistor RS, the source-follower transistor SF, and finally, the source follower voltage supply connection 428.

As shown in FIG. 4, the minor image between pixel transistor layouts of pixel units 1 and 2 is taken about a vertical (along the y-axis) line 424 that separates pixel unit 2 from pixel unit 1. In one embodiment, line 424 bisects the reset voltage supply connection 422 such that the mirror image is taken about the center of the reset voltage supply connection 422. Thus, the reset transistor RST of pixel unit 1 is adjacent to the reset transistor RST of pixel unit 2 where both reset transistors are coupled to the same reset voltage supply connection 422. Therefore, reset voltage supply connection 422 is a shared connection that is shared between pixel unit 1 and pixel unit 2. Having mirrored transistor layouts and a shared reset voltage supply connection 422 may provide for more space and better isolation between components of the pixel transistor regions so as to reduce leakage. Furthermore, having a shared reset voltage supply connection 422 may require less metal routing which reduces interconnect coupling.

As mentioned above, the pixel transistor layout of each pixel transistor region is a mirror image of the pixel transistor layout of a horizontally adjacent pixel transistor region. Thus, not only is the pixel transistor layout of pixel unit 2 a minor image of the pixel transistor layout of pixel unit 1, but the pixel transistor layout of pixel unit 3 is also a mirror image of that of pixel unit 2. Therefore, pixel unit 3 and pixel unit 2 share a source follower voltage supply connection 428, with the source follower transistor SF of pixel unit 2 disposed adjacent to the source follower transistor SF of pixel unit 3. As shown in FIG. 4, the mirror image between pixel transistor layouts of pixel units 2 and 3 is taken about a vertical (along the y-axis) line 430 that separates pixel unit 3 from pixel unit 2. In one embodiment, line 430 bisects the source follower voltage supply connection 428 such that the minor image is taken about the center of the source follower voltage supply connection 428.

Having mirrored transistor layouts and a shared source follower voltage supply connection 428 between pixel units may provide for further space and better isolation between components of the pixel transistor regions so as to further reduce leakage. Furthermore, having a shared source follower voltage supply connection 422 may require less metal routing which further reduces interconnect coupling.

In one embodiment, the mirrored transistor layouts and shared connections (e.g., connection 422 and 428) provide additional pixel area that can be allocated to other additional features within the pixel transistor region. For example, the additional pixel area can be used to provide a grounding node (i.e., a ground contact), an anti-blooming node (i.e., a doped well to collect blooming excess signal), or may be used to allow for a larger source follower transistor SF to provide for lower random telegraph (RTG) noise.

Figure 5:
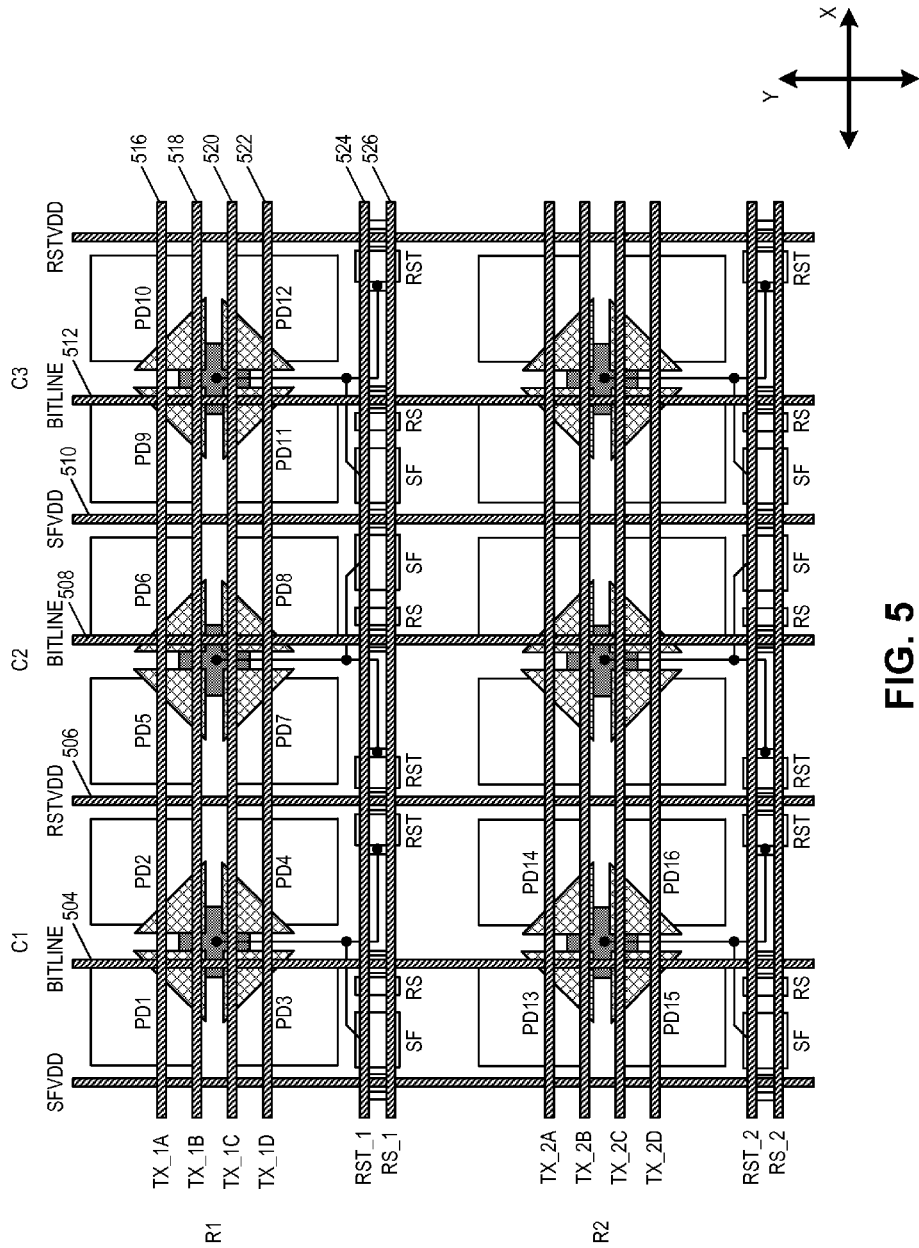
FIG. 5 is a diagram of the six pixel units of FIG. 4 further illustrating several metal routings.

FIG. 5 is a diagram of the six pixel units of FIG. 4 further illustrating several metal routings. As mentioned above, the six pixel units are arranged into two rows (R1 and R2) and three columns (C1 to C3) of pixel units, which includes a total of 4 rows and 6 columns of pixels. Shown in FIG. 5 are vertical (along the y-axis) metal routings 504-512 and horizontal (along the x-axis) metal routings 516-526. In one embodiment, each metal routing is one or more layer of metal included in the image sensor for routing signals to or from the previously discussed connections (e.g., connections 418, 420, 422, 426, and 428 of FIG. 4).

Each column of pixel units may include a respective column bitline routing (column bitline routing 504, 508 and 512) for outputting image data from the respective column. However, the source follower voltage supply routings (SFVDD) and the reset voltage supply routings (RSTVDD) are shared routings that are shared among adjacent columns. For example, RSTVDD 506 is shared among pixel units of both the first C1 and second C2 columns, while SFVDD 510 is shared among pixel units of both the second C2 and third C3 columns. In one embodiment, the source follower voltage supply is separate from the reset voltage supply so that each can be independently set.

As mentioned above, the transistor layout of a pixel unit is a mirror image of that of a horizontally adjacent pixel unit. Thus, in one embodiment, the mirror images may be taken about the vertical metal routings. For example, the transistor layout of pixel unit 1 (i.e., row R1, column C1) is a mirror image of the transistor layout of pixel unit 2 (i.e., row R1, column C2) taken about the reset voltage supply routing RSTVDD 506, which runs vertically (along the y-axis) between the first pixel unit and the second pixel unit. Similarly, the transistor layout of pixel unit 2 is a mirror image of the transistor layout of pixel unit 3 (i.e., row R1, column C3) taken about the source follower voltage supply routing SFVDD 510, which runs vertically between the second pixel unit and the third pixel unit.

Having shared routings may provide for more space and better isolation between components of the pixel units so as to reduce leakage. Furthermore, having a shared metal routings reduces interconnect couplings, simplifies fabrication, and reduces cost.

Also shown in FIG. 5 are horizontal metal routings 516-526. Metal routings 516-522 are for providing the transfer signals for controlling the transfer gates included in the first row R1 of pixel units. Metal routings 524 and 526 are for providing the reset and row select signals, respectively, to the reset RST and row select RS transistors of the first row R1 of pixel units.

Figure 6:
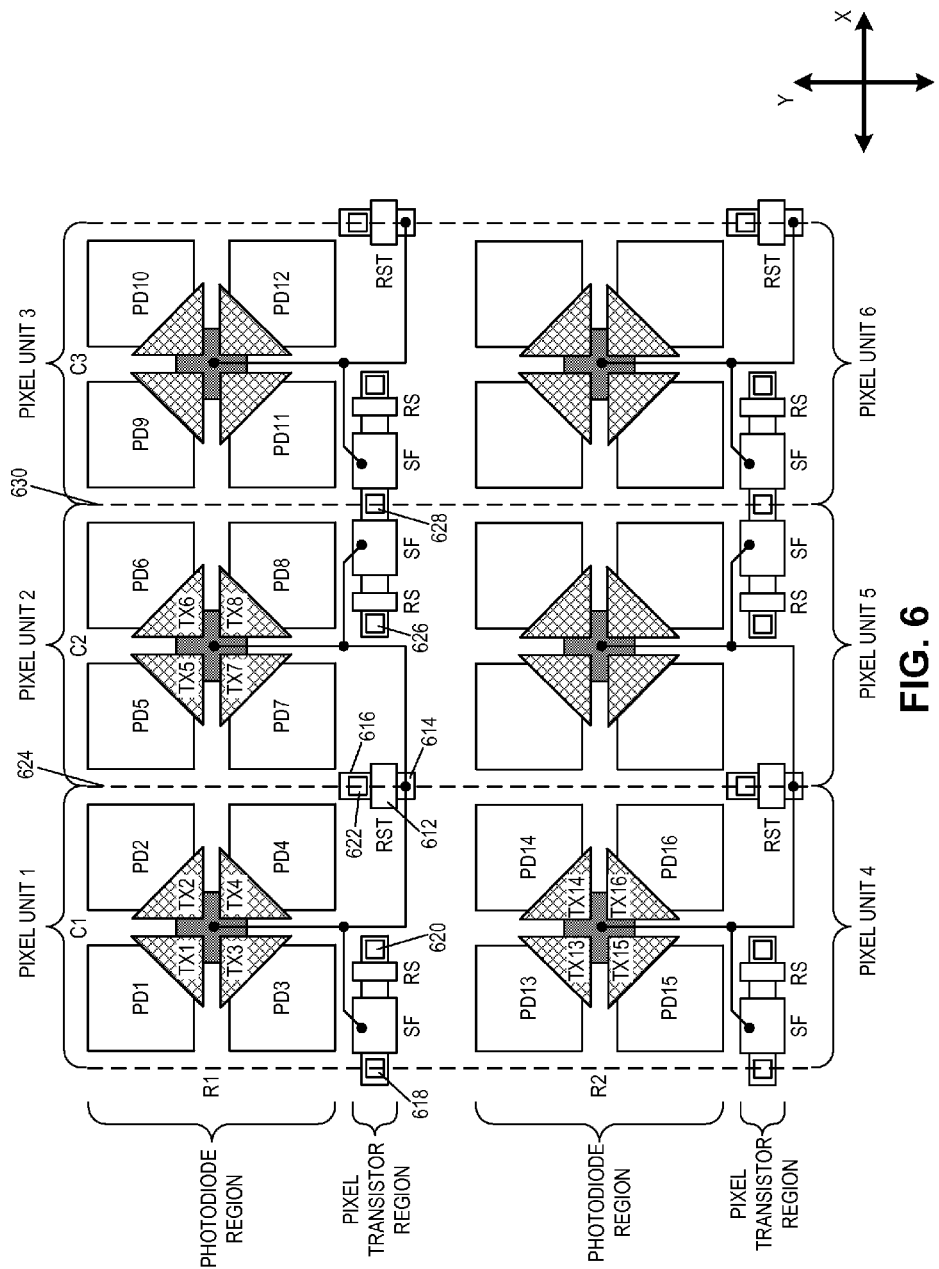
FIG. 6 is a diagram of six pixel units of an image sensor having mirrored transistor layouts and a shared reset transistor, in accordance with an embodiment of the present disclosure.

FIG. 6 is a diagram of six pixel units of an image sensor having mirrored transistor layouts and a shared reset transistor RST, in accordance with an embodiment of the present disclosure. The six pixel units of FIG. 6 are arranged into two rows (R1 and R2) and three columns (C1 to C3) of pixel units, which includes a total of 4 rows and 6 columns of pixels. Pixel units 1-6 may represent, at least, some of the pixel units included in array 200 of FIG. 2. For example, pixel unit 1 may correspond to pixel unit 202 of FIG. 2, pixel unit 2 may correspond to pixel unit 204, and pixel unit 4 may correspond to pixel unit 208.

The pixel units of FIG. 6 are similar in structure and function to the pixel units of FIG. 4, described above. However, the pixel units of FIG. 6 include a shared reset transistor that is shared between horizontally adjacent pixel transistor regions. For example, FIG. 6 illustrates a shared reset transistor RST that is shared between the pixel transistor region of pixel unit 1 and the pixel transistor region of pixel unit 2. The shared reset transistor RST is shown as including a gate 612 and doped regions 614 and 616. Also shown in FIG. 6 is a shared reset voltage supply connection 622. As with the pixel units of FIG. 4, the pixel transistor layout of each pixel transistor region illustrated in FIG. 6 is a minor image of the pixel transistor layout of a horizontally adjacent pixel transistor region. That is, in one embodiment, the pixel transistor layout of one pixel transistor region is identical, but reversed from that of a horizontally adjacent pixel transistor region. By way of example, the pixel transistor layout of the pixel transistor region of pixel unit 2 is a minor image of the pixel transistor layout of the pixel transistor region of pixel unit 1. Reading from left to right along the x-axis, the transistor layout of pixel unit 1 includes a source follower voltage supply connection 618, the source-follower transistor SF, the row select transistor RS, a column bitline connection 620, and the shared reset transistor RST and reset voltage supply connection 622. This transistor layout is mirrored by the transistor layout of pixel unit 2. That is, still reading from left to right, the transistor layout of pixel unit 2 includes the reset voltage supply connection 622 and shared reset transistor RST, the column bitline connection 626, the row select transistor RS, the source-follower transistor SF, and finally, a shared source follower voltage supply connection 628.

As shown in FIG. 6, the minor image between pixel transistor layouts of pixel units 1 and 2 is taken about a vertical (along the y-axis) line 624 that separates pixel unit 2 from pixel unit 1. In one embodiment, line 624 bisects the reset voltage supply connection 622 such that the mirror image is taken about the center of the reset voltage supply connection 622. In another embodiment, line 624 bisect the shared reset transistor RST such that the mirror image is taken about the center of the reset transistor RST.

Having mirrored transistor layouts and a shared reset transistor RST and shared reset voltage supply connection 622 may provide for more space and better isolation between components of the pixel transistor regions so as to further reduce leakage. Furthermore, having a shared reset voltage supply connection 622 and shared reset transistor RST may require less metal routing which reduces interconnect coupling.

As mentioned above, the pixel transistor layout of each pixel transistor region is a mirror image of the pixel transistor layout of a horizontally adjacent pixel transistor region. Thus, not only is the pixel transistor layout of pixel unit 2 a minor image of the pixel transistor layout of pixel unit 1, but the pixel transistor layout of pixel unit 3 is also a mirror image of that of pixel unit 2. Therefore, pixel unit 3 and pixel unit 2 share a source follower voltage supply connection 628, with the source follower transistor SF of pixel unit 2 disposed adjacent to the source follower transistor SF of pixel unit 3. As shown in FIG. 6, the mirror image between pixel transistor layouts of pixel units 2 and 3 is taken about a vertical (along the y-axis) line 630 that separates pixel unit 3 from pixel unit 2. In one embodiment, line 630 bisects the source follower voltage supply connection 628 such that the minor image is taken about the center of the source follower voltage supply connection 628.

Figure 7:
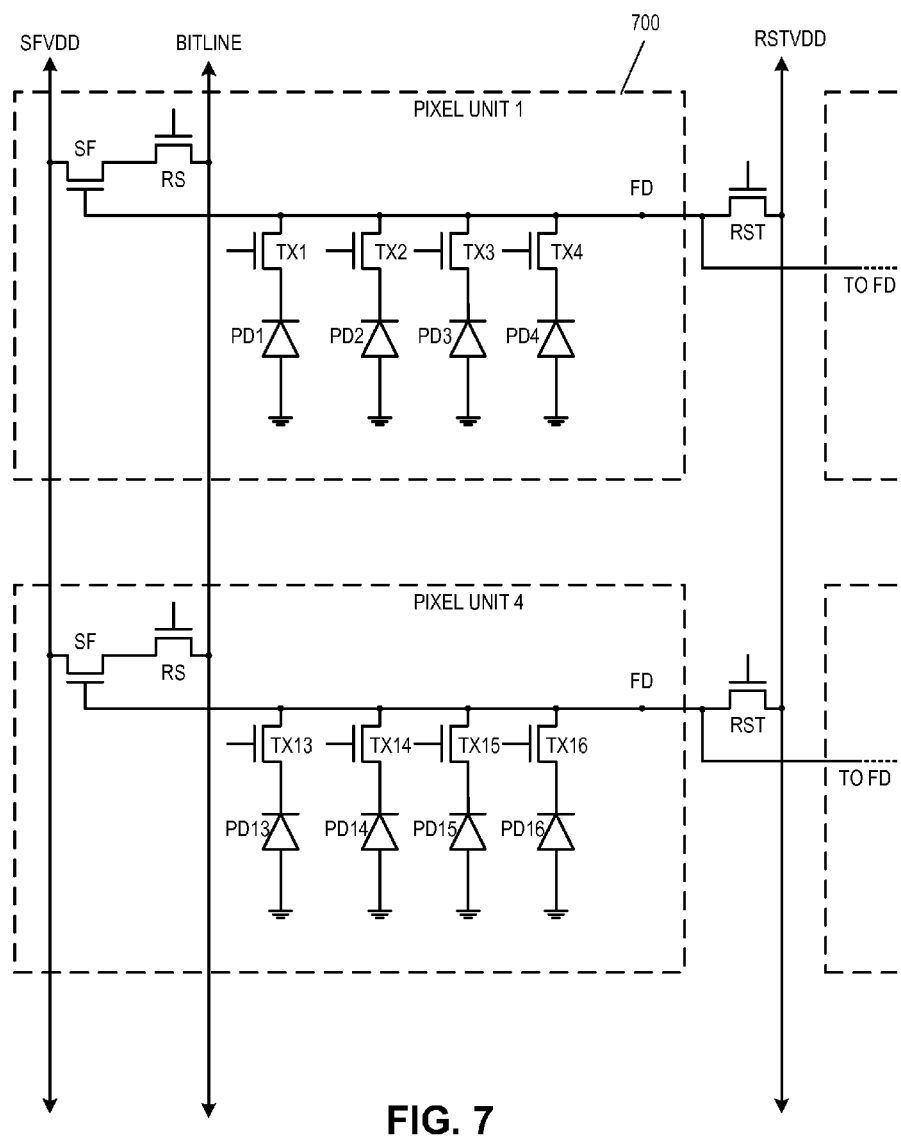
FIG. 7 is a circuit diagram illustrating pixel circuitry of two pixel units within an image sensor having shared reset transistors, in accordance with an embodiment of the present disclosure.

FIG. 7 is a circuit diagram illustrating pixel circuitry of two pixel units within an image sensor having shared reset transistors, in accordance with an embodiment of the present disclosure. Pixel circuitry 700 is one possible pixel circuitry architecture for implementing each pixel unit within array 200 of FIG. 2. However, it should be appreciated that embodiments of the present invention are not limited to the illustrated pixel architectures; rather, one of ordinary skill in the art having the benefit of the instant disclosure will understand that the present teachings are also applicable to various other pixel architectures.

In FIG. 7, pixel unit 1 and pixel unit 4 are arranged in two rows and one column. The illustrated embodiment of each pixel circuitry includes four photodiodes (PD1-PD4), four transfer transistors (TX1-TX4), a source-follower transistor SF, and a row select transistor RS. Also shown in FIG. 3 is a shared reset transistor RST that is shared among horizontally (along the x-axis) adjacent pixel units. During a readout operation of the first photodiode PD1, transfer transistor TX1 receives a transfer signal, which causes transfer transistor TX1 to transfer the charge accumulated in photodiode PD1 to a shared floating diffusion region FD.

Shared reset transistor RST is coupled between a reset voltage supply RSTVDD and the floating diffusion region FD to reset (e.g., discharge or charge the FD to a preset voltage) under control of a reset signal. The floating diffusion region FD is coupled to the gate of the source-follower transistor SF. The source-follower transistor SF is coupled between a source-follower voltage supply SFVDD and row select transistor RS. The source-follower transistor SF operates as a source-follower providing a high impedance output from floating diffusion region FD. Finally, row select transistor RS selectively couples the output of the pixel circuitry to the column bitline under control of a row select signal.

Figure 8:
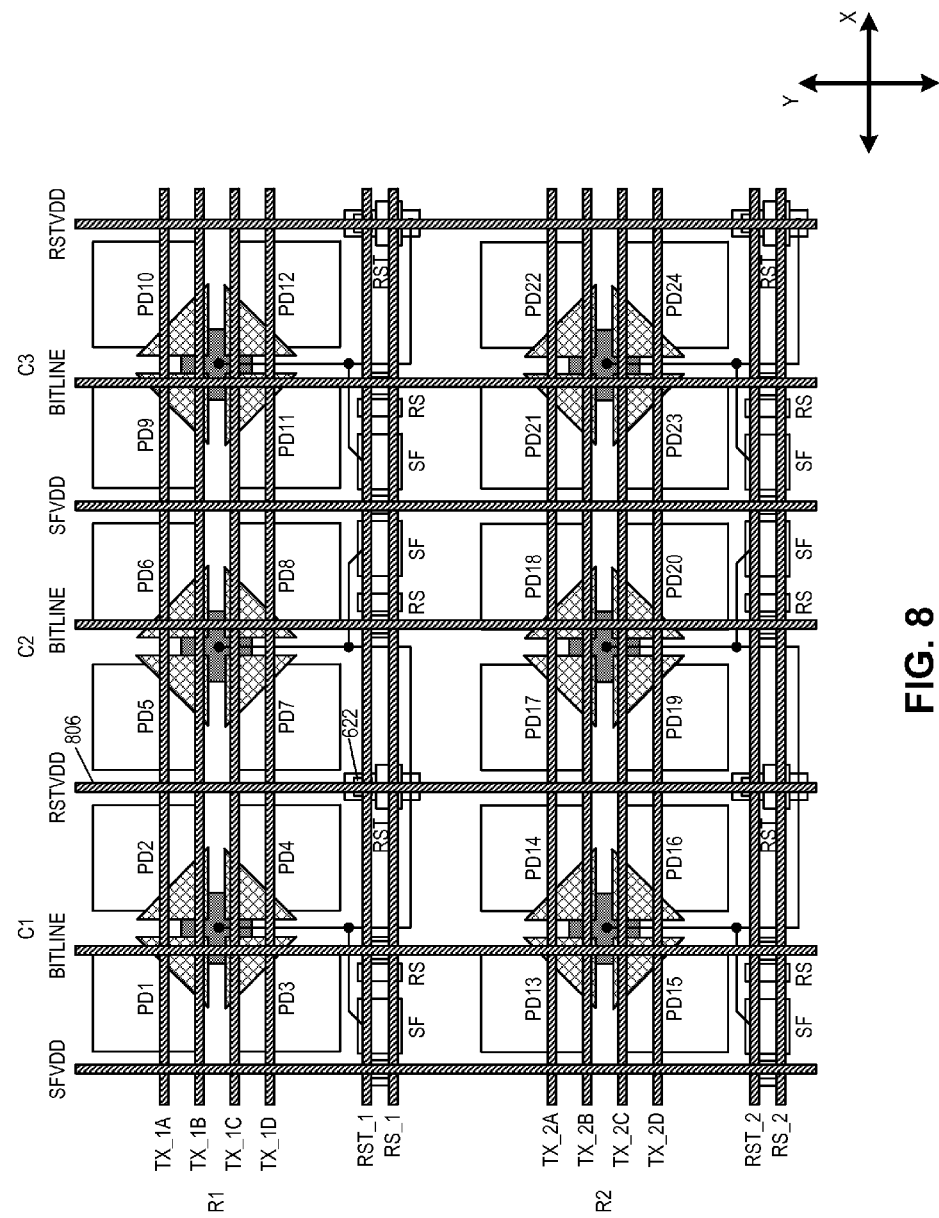
FIG. 8 is a diagram of the six pixel units of FIG. 6, further illustrating several metal routings.

FIG. 8 is a diagram of the six pixel units of FIG. 6, further illustrating several metal routings. The metal routings of FIG. 8 are similar in structure and function to the metal routings of FIG. 5, described above. However, the vertical reset voltage supply routing RSTVDD 806 is disposed to bisect the reset voltage supply connection 622 and also to bisect the shared reset transistor RST, itself.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor comprising:
   a first pixel unit having a first plurality of photodiodes and a first shared floating diffusion region;
   a second pixel unit, horizontally adjacent to the first pixel unit, having a second plurality of photodiodes and a second shared floating diffusion region;
   a first pixel transistor region of the first pixel unit having a plurality of pixel transistors for reading out image data from the first shared floating diffusion region; and
   a second pixel transistor region of the second pixel unit, horizontally adjacent to the first pixel transistor region, having a plurality of pixel transistors for reading out image data from the second shared floating diffusion region;
   wherein:
      a transistor layout of the second pixel transistor region is a mirror image of a transistor layout of the first pixel transistor region,
      the pixel transistor regions each include a reset transistor, a row select transistor, and a source-follower transistor, and
      the reset transistor of the first pixel transistor region is disposed adjacent to the reset transistor of the second pixel transistor region and the reset transistors are both coupled to the same shared reset voltage supply connection.

2. The image sensor of claim 1, wherein the minor image is taken about a vertical line separating the first pixel unit from the second pixel unit.

3. The image sensor of claim 1, wherein each pixel unit has no more than one shared floating diffusion region.

4. The image sensor of claim 1, wherein each of the plurality of photodiodes includes no more and no less than four photodiodes.

5. The image sensor of claim 1, further comprising:
a third pixel unit, horizontally adjacent to the second pixel unit, having a third plurality of photodiodes and a third shared floating diffusion region; and
a third pixel transistor region of the third pixel unit, horizontally adjacent to the second pixel transistor region, having a plurality of pixel transistors for reading out image data from the third shared floating diffusion region,
wherein a transistor layout of the third pixel transistor region is a minor image of the transistor layout of the second pixel transistor region.

6. The image sensor of claim 1, further comprising:
a third pixel unit, horizontally adjacent to the second pixel unit, having third photodiode region of no more and no less than four photodiodes and a third shared floating diffusion region; and
a third pixel transistor region of the third pixel unit, vertically displaced outside of the third photodiode region and horizontally adjacent to the second pixel transistor region, the third pixel transistor region having a reset transistor, a row select transistor, and a source-follower transistor,
wherein a transistor layout of the third pixel transistor region is a minor image of the transistor layout of the second pixel transistor region, taken about a vertical line separating the second pixel unit from the third pixel unit.

7. A complementary metal oxide semiconductor (CMOS) image sensor comprising:
a first pixel unit having a first photodiode region of no more and no less than four photodiodes and a first shared floating diffusion region;
a second pixel unit, horizontally adjacent to the first pixel unit, having a second photodiode region of no more and no less than four photodiodes and a second shared floating diffusion region;
a first pixel transistor region of the first pixel unit, vertically displaced outside of the first photodiode region and having a reset transistor, a row select transistor, and a source-follower transistor; and
a second pixel transistor region of the second pixel unit, vertically displaced outside of the second photodiode region and horizontally adjacent to the first pixel transistor region, the second pixel transistor region having a reset transistor, a row select transistor, and a source-follower transistor,
wherein:
a transistor layout of the second pixel transistor region is a mirror image of a transistor layout of the first pixel transistor region, taken about a vertical line separating the first pixel unit from the second pixel unit, and
the source-follower transistor of the first pixel transistor region is disposed adjacent to the source follower transistor of the second pixel transistor region and the source follower transistors are both coupled to the same shared source follower voltage supply connection.

8. The image sensor of claim 7, wherein the reset transistor of the first pixel transistor region is disposed adjacent to the reset transistor of the second pixel transistor region and wherein the reset transistors are both coupled to the same shared reset voltage supply connection.

9. The image sensor of claim 7, wherein each pixel unit has no more than one shared floating diffusion region.

10. A complementary metal oxide semiconductor (CMOS) image sensor comprising:
a first pixel unit having a first photodiode region of no more and no less than four photodiodes and a first shared floating diffusion region;
a second pixel unit, horizontally adjacent to the first pixel unit, having a second photodiode region of no more and no less than four photodiodes and a second shared floating diffusion region;
a third pixel unit, horizontally adjacent to the second pixel unit, having third photodiode region of no more and no less than four photodiodes and a third shared floating diffusion region;
a first pixel transistor region of the first pixel unit, vertically displaced outside of the first photodiode region and having a row select transistor and a source-follower transistor;
a second pixel transistor region of the second pixel unit, vertically displaced outside of the second photodiode region and horizontally adjacent to the first pixel transistor region, the second pixel transistor region having a row select transistor and a source-follower transistor;
a third pixel transistor region of the third pixel unit, vertically displaced outside of the third photodiode region and horizontally adjacent to the second pixel transistor region, the third pixel transistor region having a row select transistor and a source-follower transistor; and
a shared reset transistor that is shared between the first and second pixel transistor regions;
wherein:
a transistor layout of the second pixel transistor region is a mirror image of a transistor layout of the first pixel transistor region, taken about a vertical line bisecting the shared reset transistor,
a transistor layout of the third pixel transistor region is a minor image of the transistor layout of the second pixel transistor region, taken about a vertical line separating the second pixel unit from the third pixel unit, and
the source-follower transistor of the second pixel transistor region is disposed adjacent to the source follower transistor of the third pixel transistor region.

11. An image sensor comprising:
a first pixel unit having a first plurality of photodiodes and a first shared floating diffusion region;
a second pixel unit, horizontally adjacent to the first pixel unit, having a second plurality of photodiodes and a second shared floating diffusion region;
a first pixel transistor region of the first pixel unit having a plurality of pixel transistors for reading out image data from the first shared floating diffusion region; and
a second pixel transistor region of the second pixel unit, horizontally adjacent to the first pixel transistor region, having a plurality of pixel transistors for reading out image data from the second shared floating diffusion region;
wherein:
a transistor layout of the second pixel transistor region is a minor image of a transistor layout of the first pixel transistor region,
the pixel transistor regions each include a reset transistor, a row select transistor, and a source-follower transistor, and
the source-follower transistor of the first pixel transistor region is disposed adjacent to the source follower transistor of the second pixel transistor region and the source follower transistors are both coupled to the same shared source follower voltage supply connection.

12. The image sensor of claim 11 wherein the mirror image is taken about a vertical line separating the first pixel unit from the second pixel unit.

13. The image sensor of claim 11 wherein each pixel unit has no more than one shared floating diffusion region.

14. The image sensor of claim 11 wherein each of the plurality of photodiodes includes no more and no less than four photodiodes.

15. The image sensor of claim 11, further comprising:
a third pixel unit, horizontally adjacent to the second pixel unit, having third photodiode region of no more and no less than four photodiodes and a third shared floating diffusion region; and
a third pixel transistor region of the third pixel unit, vertically displaced outside of the third photodiode region and horizontally adjacent to the second pixel transistor region, the third pixel transistor region having a reset transistor, a row select transistor, and a source-follower transistor;
wherein a transistor layout of the third pixel transistor region is a minor image of the transistor layout of the second pixel transistor region, taken about a vertical line separating the second pixel unit from the third pixel unit.

16. An image sensor comprising:
a first pixel unit having a first plurality of photodiodes and a first shared floating diffusion region;
a second pixel unit, horizontally adjacent to the first pixel unit, having a second plurality of photodiodes and a second shared floating diffusion region;
a first pixel transistor region of the first pixel unit having a plurality of pixel transistors for reading out image data from the first shared floating diffusion region; and
a second pixel transistor region of the second pixel unit, horizontally adjacent to the first pixel transistor region, having a plurality of pixel transistors for reading out image data from the second shared floating diffusion region;
wherein:
a transistor layout of the second pixel transistor region is a minor image of a transistor layout of the first pixel transistor region, and
the pixel transistor regions each include a row select transistor and a source-follower transistor, and
the image sensor further comprises a shared reset transistor that is shared between the first and second pixel transistor regions and wherein the mirror image is taken about a vertical line bisecting the shared reset transistor.

17. An image sensor comprising:
a first pixel unit having a first plurality of photodiodes and a first shared floating diffusion region;
a second pixel unit, horizontally adjacent to the first pixel unit, having a second plurality of photodiodes and a second shared floating diffusion region;
a first pixel transistor region of the first pixel unit having a plurality of pixel transistors for reading out image data from the first shared floating diffusion region; and
a second pixel transistor region of the second pixel unit, horizontally adjacent to the first pixel transistor region, having a plurality of pixel transistors for reading out image data from the second shared floating diffusion region;
wherein:
a transistor layout of the second pixel transistor region is a minor image of a transistor layout of the first pixel transistor region,
the first pixel transistor region is vertically displaced outside of a first photodiode region including the first plurality of photodiodes, and
the second pixel transistor region is vertically displaced outside of a second photodiode region including the second plurality of photodiodes.

18. An image sensor comprising:
a first pixel unit having a first plurality of photodiodes and a first shared floating diffusion region;
a second pixel unit, horizontally adjacent to the first pixel unit, having a second plurality of photodiodes and a second shared floating diffusion region;
a third pixel unit, horizontally adjacent to the second pixel unit, having a third plurality of photodiodes and a third shared floating diffusion region;
a first pixel transistor region of the first pixel unit having a plurality of pixel transistors for reading out image data from the first shared floating diffusion region;
a second pixel transistor region of the second pixel unit, horizontally adjacent to the first pixel transistor region, having a plurality of pixel transistors for reading out image data from the second shared floating diffusion region;
a third pixel transistor region of the third pixel unit, horizontally adjacent to the second pixel transistor region, having a plurality of pixel transistors for reading out image data from the third shared floating diffusion region;
wherein:
a transistor layout of the second pixel transistor region is a mirror image of a transistor layout of the first pixel transistor region,
a transistor layout of the third pixel transistor region is a mirror image of the transistor layout of the second pixel transistor region, and
a reset transistor of the first pixel transistor region is disposed adjacent to a reset transistor of the second pixel transistor region and a source-follower transistor of the second pixel transistor region is disposed adjacent to a source follower transistor of the third pixel transistor region.

19. A complementary metal oxide semiconductor (CMOS) image sensor comprising:
a first pixel unit having a first photodiode region of no more and no less than four photodiodes and a first shared floating diffusion region;
a second pixel unit, horizontally adjacent to the first pixel unit, having a second photodiode region of no more and no less than four photodiodes and a second shared floating diffusion region;
a first pixel transistor region of the first pixel unit, vertically displaced outside of the first photodiode region and having a reset transistor, a row select transistor, and a source-follower transistor; and
a second pixel transistor region of the second pixel unit, vertically displaced outside of the second photodiode region and horizontally adjacent to the first pixel transistor region, the second pixel transistor region having a reset transistor, a row select transistor, and a source-follower transistor;
wherein:
a transistor layout of the second pixel transistor region is a mirror image of a transistor layout of the first pixel transistor region taken about a vertical line separating the first pixel unit from the second pixel unit, the reset transistor of the first pixel transistor region is disposed adjacent to the reset transistor of the second pixel transistor region and the source-follower transistor of the second pixel transistor region is disposed adjacent to the source follower transistor of the third pixel transistor region.

* * * * *